(12) United States Patent
Nasu et al.

(10) Patent No.: US 7,220,598 B1
(45) Date of Patent: May 22, 2007

(54) METHOD OF MAKING FERROELECTRIC THIN FILM HAVING A RANDOMLY ORIENTED LAYER AND SPHERICAL CRYSTAL CONDUCTOR STRUCTURE

(75) Inventors: Toru Nasu, Kyoto (JP); Shinichiro Hayashi, Osaka (JP)

(73) Assignee: Matsushita Electric Industrial Co., Ltd., Osaka (JP)

( * ) Notice: Subject to any disclaimer, the term of this patent is extended or adjusted under 35 U.S.C. 154(b) by 53 days.

(21) Appl. No.: 09/639,157

(22) Filed: Aug. 16, 2000

(30) Foreign Application Priority Data

Aug. 18, 1999 (JP) .................................. 11-231111

(51) Int. Cl.
*H01L 21/00* (2006.01)

(52) U.S. Cl. .......................................................... 438/3

(58) Field of Classification Search .................... 438/3, 438/106, 240, 608–610, 486–490, 758, 679, 438/660, 256; 257/295, 314–320, 310, 254; 427/62
See application file for complete search history.

(56) References Cited

U.S. PATENT DOCUMENTS

| | | | |
|---|---|---|---|
| 3,728,694 A * | 4/1973 | Rohrer | ........................ 361/321 |
| 3,850,612 A * | 11/1974 | Montino et al. | .................. 75/5 |
| 5,146,299 A * | 9/1992 | Lampe et al. | ................ 257/295 |
| 5,527,567 A | 6/1996 | Desu et al. | |
| 5,623,724 A * | 4/1997 | Gurkovich et al. | ......... 438/486 |
| 5,825,057 A | 10/1998 | Watanabe et al. | |
| 6,054,331 A * | 4/2000 | Woo et al. | ....................... 438/3 |
| 6,151,241 A * | 11/2000 | Hayashi et al. | ............. 365/145 |
| 6,232,167 B1 * | 5/2001 | Satoh et al. | ................. 438/240 |
| 6,316,100 B1 * | 11/2001 | Kodas et al. | ................ 428/357 |
| 2001/0002273 A1 * | 5/2001 | Joshi et al. | .................... 427/62 |

FOREIGN PATENT DOCUMENTS

| | | |
|---|---|---|
| EP | 0 878 837 A2 | 11/1998 |
| JP | 6-21338 | 1/1994 |
| JP | 6-65715 | 3/1994 |
| JP | 09-069614 | 3/1997 |
| JP | 09-153597 | 6/1997 |
| JP | 09-213905 | 8/1997 |
| JP | 09-321237 | 12/1997 |
| JP | 10-312977 | 11/1998 |
| JP | 10-326755 | 12/1998 |
| JP | 11-80181 | 3/1999 |
| JP | 11-97634 | 4/1999 |
| JP | 11-97635 | 4/1999 |
| WO | WO 99/32684 | 12/1998 |

OTHER PUBLICATIONS

Desu et al., "Oriented Growth of SrBi2Ta2O9 Ferroelectric thin films", Appl. Phys. Lett. 69 (12) ,pp. 17191721, Sep. 1996.*

(Continued)

*Primary Examiner*—Carl Whitehead, Jr.
*Assistant Examiner*—Monica Harrison
(74) *Attorney, Agent, or Firm*—Nixon Peabody LLP; Donald R. Studebaker

(57) ABSTRACT

A method of making a ferroelectric thin film includes the step of forming a ferroelectric thin film with a randomly oriented layered structure on a surface of a conductor layer. At least the surface of the conductor layer has a spherical crystal structure.

7 Claims, 5 Drawing Sheets

OTHER PUBLICATIONS

Desu et al., "Oriented Growth of SrBi2Ta2O9 Ferroelectric thin films", Appl. Phys. Lett. 69 (2), pp. 1719-1721, Sep. 1996.*

D. S. McIntyre et al., "Electrical Characterization of PZT on Rapid Thermally Annealed Ruthenium Oxide Electrodes," *Integrated Ferroelectrics*, 1995, pp. 301-308, vol. 10, Gordon and Breach Science Publishers SA, published in the Netherlands.

S. B. Desu et al., "Oriented Growth of $SrBi_2Ta_2O_9$ Ferroelectric Thin Films", *Applied Physics Letters*, Sep. 16, 1996, pp. 1719-1721, vol. 69 (12), American Institute of Physics, New York.

S. Kim et al., "Impact of Changes in the Pt Heterostructure Bottom Electrodes on the Ferroelectric Properties of SBT Thin Films," *Integrated Ferroelectrics*, 1999, pp. 253-268, vol. 26, Malaysia, Gordon and Breach Science Publishers.

K. Watanabe et al., "Spin-coated Ferroelectric $SrBi_2Nb_2O_9$ Thin Films," *Applied Physics Letters*, Jul. 6, 1999, pp. 126-128, vol. 73 (1), American Institute of Physics, New York.

European Search Report dated Dec 18, 2003.

Jul. 6, 2004 Office Action for JP Application No. 2000-218419.

Chinese Office Action Dated Jul. 18, 2003.

* cited by examiner

METHOD OF MAKING FERROELECTRIC THIN FILM HAVING A RANDOMLY ORIENTED LAYER AND SPHERICAL CRYSTAL CONDUCTOR STRUCTURE

BACKGROUND OF THE INVENTION

The present invention generally relates to a method of making a ferroelectric thin film, and also relates to ferroelectric capacitor, ferroelectric memory and method for fabricating the memory. More particularly, this invention relates to a method of making a ferroelectric thin film as a capacitive insulating film for a ferroelectric memory.

Recently, a ferroelectric thin film, exhibiting a spontaneous electric polarization, has been vigorously researched and developed to realize a nonvolatile memory that can operate at an even higher speed with a lower voltage applied. Among various other ferroelectric materials, low-melting metal oxides thereof, containing lead or bismuth, have often been studied widely. Specifically, layer-structured ferroelectrics, e.g., those containing bismuth, in particular, have attracted much attention.

A basic structure of a layer-structured ferroelectric is given by the following general formula:

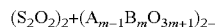

$(S_2O_2)_2 + (A_{m-1}B_mO_{3m+1})_{2-}$ where the S site is replaced with a trivalent cation of a constituent material (e.g., Bi or Tl) of the layered structure or a combination thereof; the A site is replaced with a univalent, divalent or trivalent cation of Na, Sr, Pb, Bi, Ba, Ca or La or a combination thereof; the B site is replaced with a tetravalent or pentavalent cation of Ti, Ta, Nb, Zr, Mo or W or a combination thereof; and m is an integer typically between 1 and 5. It is noted that mutually different m values may sometimes be used in combination to improve the property of the ferroelectric. For example, if a composition with m=3 is combined with a composition with m=1, then the distance between two adjacent layers in the layered structure can be changed arbitrarily.

Since the ferroelectric like this has a layered structure, the ferroelectric does not deteriorate so much even after its polarization has been reversed numerous times. Accordingly, a nonvolatile memory, including this layer-structured ferroelectric thin film, can operate with a relatively low voltage applied. In other words, the ferroelectric is effectively applicable as a material for a capacitive insulating film of a nonvolatile memory. Particularly, a layer-structured ferroelectric with its S site replaced with bismuth (which will be herein called a "bismuth layer-structured ferroelectric") contains bismuth, which is a low-melting metal, and can be deposited at a relatively low temperature. For example, $SrBi_2Ta_2O_9$ is usually heat-treated at about 800° C. To realize a semiconductor process at an even smaller feature size, however, the temperature of heat treatment should be further lowered. For instance, a stacked memory cell structure must be implemented to realize a very densely integrated memory operating at 1 megabit or more. In the implementation of the stacked memory cell structure, the heat treatment should be conducted at a temperature between 650 and 700° C. in view of the thermal resistance of a barrier layer (e.g., iridium oxide layer) provided to prevent reaction between electrode and plug.

A ferroelectric thin film is normally formed by a thermolysis process or a spin coating technique utilizing a sol-gel process. To further lower the heat treatment temperature, however, the sol-gel process is preferred, because this process positively takes advantage of chemical reactions. Specifically, in a sol-gel process, crystals are grown to form a thin film through polycondensation reactions with hydrolysis using a solution containing a strongly reactive metal alkoxide.

In a bismuth layer-structured ferroelectric thin film formed by the known sol-gel process, most of the crystals grown are eventually oriented along the c-axis. Generally speaking, most of the electric dipole moments of a bismuth layer-structured ferroelectric thin film exist in the a- and b-axis planes. In contrast, there are no dipole moments, or very small moments if any, along the c-axis. Thus, if a capacitor is made using a c-axis-oriented ferroelectric thin film like this, then the ferroelectric capacitor cannot exhibit spontaneous polarization strong enough to enable a nonvolatile memory to operate properly.

SUMMARY OF THE INVENTION

It is therefore an object of the present invention to provide a method of making a non-c-axis-oriented layer-structured ferroelectric thin film by a sol-gel process.

An inventive method of making a ferroelectric thin film includes the step of forming a ferroelectric thin film with a randomly oriented layered structure on a surface of a conductor layer. At least the surface of the conductor layer has a spherical crystal structure.

In one embodiment of the present invention, the step of forming the ferroelectric thin film preferably includes the step of applying a precursor solution, containing an organometallic compound, to the surface of the conductor layer and then baking the solution on the conductor layer.

In this particular embodiment, the organometallic compound preferably includes at least two metal atoms per molecule.

In another embodiment, the step of forming the ferroelectric thin film is performed preferably at 700° C. or less, more preferably at 650° C. or less.

In still another embodiment, the ferroelectric thin film with the layered structure may have a bismuth layered structure.

In this particular embodiment, the ferroelectric thin film with the bismuth layered structure preferably contains at least one element selected from the group consisting of Mn, La, Ce and Dy at a small mole fraction.

An inventive ferroelectric capacitor includes: a lower electrode, at least a surface of the lower electrode having a spherical crystal structure; and a capacitive insulating film formed on the surface of the lower electrode. The capacitive insulating film is formed out of a ferroelectric thin film with a randomly oriented layered structure. The ferroelectric thin film is formed by applying a precursor solution to the surface of the lower electrode and then baking the solution on the lower electrode. The precursor solution contains an organometallic compound including at least two metal atoms per molecule.

Another inventive ferroelectric capacitor includes: a lower electrode, at least a surface of the lower electrode having a spherical crystal structure; and a capacitive insulating film formed on the surface of the lower electrode. The capacitive insulating film is formed out of a ferroelectric thin film with a randomly oriented layered structure. And the ferroelectric thin film is formed with the lower electrode heated up to 700° C. or less.

An inventive ferroelectric memory includes: a substrate on which a semiconductor integrated circuit is formed; and a ferroelectric capacitor formed on the substrate. The ferroelectric capacitor includes: a lower electrode, at least a surface of the lower electrode having a spherical crystal structure; and a capacitive insulating film formed on the surface of the lower electrode and made of a ferroelectric thin film with a randomly oriented layered structure. And the ferroelectric capacitor has a stacked structure.

An inventive method for fabricating a ferroelectric memory includes the step of forming a ferroelectric thin film with a randomly oriented layered structure on a surface of a conductor layer. At least the surface of the conductor layer has a spherical crystal structure.

DESCRIPTION OF THE PREFERRED EMBODIMENTS

Figure 1A:
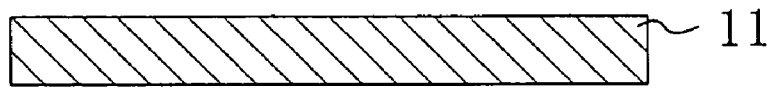
FIGS. 1A through 1C are cross-sectional views illustrating respective process steps for making a ferroelectric thin film according to a first embodiment of the present invention.

The present inventors found that if a bismuth layer-structured ferroelectric thin film is formed by a sol-gel process on a platinum electrode with a spherical crystal structure, then the ferroelectric thin film will have a non-c-axis-oriented, randomly oriented layered structure.

Hereinafter, preferred embodiments of the present invention will be described with reference to the accompanying drawings. In the drawings, components with substantially the same function will be identified by the same reference numeral throughout the following description for the sake of simplicity. Also, it should be noted that the present invention is not limited to the following illustrative embodiments.

Embodiment 1

Figure 1B:
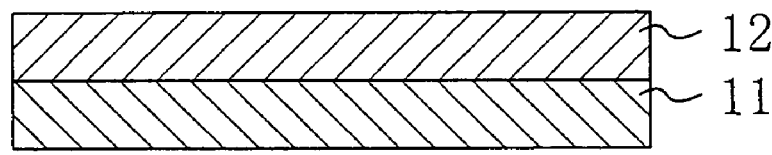
Figure 1C:
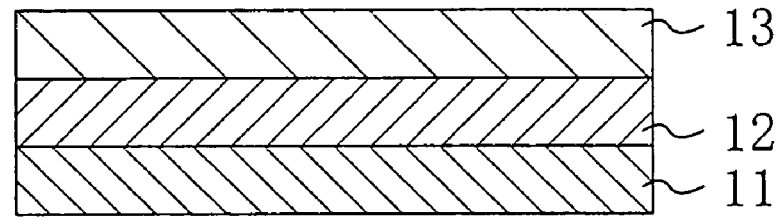

A first embodiment of the present invention will be described with reference to FIGS. 1A through 1C. FIGS. 1A through 1C are cross-sectional views illustrating respective process steps for making a ferroelectric thin film according to the first embodiment.

First, as shown in FIG. 1A, a substrate 11 is prepared. In the illustrated embodiment, a silicon substrate, on which a thermal oxide layer (thickness: 100 nm) and a titanium oxide layer (thickness: 100 nm) have been stacked in this order, is used as the substrate 11.

Next, as shown in FIG. 1B, a platinum electrode 12 is formed thereon by a sputtering process. The platinum electrode 12 is a conductor layer with a spherical crystal structure at least on the surface thereof (typically, the entire conductor layer has the spherical crystal structure). That is to say, the platinum electrode 12 is an example of the conductor layer as defined in the appended claims.

The sputtering process is carried out to form the platinum electrode 12 typically within an argon gas ambient. In the illustrated embodiment, the sputtering process is performed within an activated gas ambient with oxygen added by 4% to argon gas, at a gas pressure of 12 mTorr (=1.6 Pa) and with the temperature of the substrate 11 kept at room temperature. By performing the sputtering process under these conditions, the platinum electrode 12 with the spherical crystal structure can be obtained. Specifically, if oxygen is added during the deposition of the platinum electrode 12, then oxygen is absorbed into the platinum electrode 12 so as to deposit onto the grain boundaries. As a result, the growth of columnar crystals of platinum is inhibited to decrease their mean grain size to 20 nm or less. In the illustrated embodiment, the mean grain size of the platinum electrode 12 is about 10 nm and the thickness of the platinum electrode 12 is about 300 nm. We also found that a platinum film should preferably be deposited at a low rate. In the illustrated embodiment, the platinum film was deposited at a rate of about 15 nm/min.

Also, in this embodiment, the surface roughness of the platinum electrode 12 is about 3 nm on average. This average is equal to that obtained when a platinum electrode is deposited by a known sputtering process with no oxygen added and at a gas pressure of 8 mTorr. Accordingly, the surface roughness (about 3 nm on average) of the platinum electrode 12 in this embodiment will not cause any problem in practice considering its breakdown strength, and therefore, other layers deposited thereon can make good contact with the surface of the platinum electrode 12. In the known sputtering process, if the gas pressure is raised from the normal value of 8 mTorr to 20 mTorr, then a platinum electrode, packed with columnar crystals (not spherical ones) with rugged surfaces, is obtained. In that case, however, the average surface roughness will be 6 nm, which might possibly cause some problems in practice in view of its breakdown strength.

Then, as shown in FIG. 1C, the surface of the platinum electrode 12 is coated with a precursor solution containing an organometallic compound, and then the substrate is baked, thereby forming a ferroelectric thin film 13 on the electrode 12. That is to say, the ferroelectric thin film 13 is formed by a sol-gel process. Since the sol-gel process is adopted in this embodiment, the ferroelectric thin film 13 can be formed with the temperature of the substrate (or the platinum electrode 12) kept at 700° C. or less. To promote the crystal growth at that low temperature, the organometallic compound, contained in the precursor solution for use in the sol-gel process, preferably includes at least two metal atoms per molecule. In the illustrated embodiment, the surface of the platinum electrode 12 is coated with a solution (i.e., a pre-cursor solution) containing metal alkoxides of Sr, Bi and Ta, dried, and then heat-treated with the substrate heated up to 650° C., thereby forming a bismuth layer-structured ferroelectric thin film 13. As the metal alkoxide solution, a solution containing an Sr—Bi—Ta complex alkoxide may be used as disclosed in Japanese Laid-Open Publication No. 11-80181. In the illustrated embodiment, an Sr alkoxide (e.g., $Sr(OC_2H_4OCH_3)_2$) is allowed to react with a Bi alkoxide (e.g., $Bi(OC_2H_5)_2$) in alcohol (e.g., methoxyethanol) to produce an Sr—Bi double alkoxide (e.g., $Sr[Bi(OR)_4]_2$). Next, the Sr—Bi double alkoxide is allowed to react with a Ta alkoxide (e.g., $Ta(OC_2H_5)_5$) to obtain the Sr—Bi—Ta complex alkoxide.

We carried out an X-ray diffraction (XRD) analysis on a bismuth layer-structured ferroelectric thin film, which had been formed by the method of the present invention, to find the c-axis orientation ratio of the thin film. As used herein, the "c-axis orientation ratio" is represented as a ratio of the intensity I(0010) of a beam reflected from a crystallographic plane (0010) parallel to the c-axis to the intensity I(115) of a beam reflected from a densest plane (115), i.e., I(0010)/I (115). The following Table 1 shows the intensity ratios obtained by the present invention and the prior art along with various conditions:

TABLE 1

| Pt deposition conditions | | | Pt | | $SrBi_2Ta_2O_9$ XRD data | | |
|---|---|---|---|---|---|---|---|
| Gas Pressure (mTorr) | $O_2$ partial Pressure (%) | Substrate Temperature (° C.) | XRD Data I(111) (counts) | AFM Data Rms (nm) | I(115) (counts) | I(0010) (counts) | Intensity ration (%) |
| 12 | 4 | 25 | 139 | 3.0 | 416 | 33 | 8 |
| 8 | 0 | 25 | 5253 | 3.0 | 392 | 110 | 28 |

As can be seen from Table 1, the intensity ratio I was slightly less than 30% in the prior art. Thus, a considerable part of the film was oriented along the c-axis. That is to say, even if the ferroelectric thin film formed by the prior art method is used, a hysteresis loop of just a small magnitude will be attainable. In contrast, according to the present invention, the intensity ratio I was 8%. This value is substantially equal to that obtained for the powder of the ferroelectric. Thus, it can be seen that the ferroelectric thin film 13 formed by the inventive method was randomly oriented and non-c-axis oriented. For that reason, by using the ferroelectric thin film 13 of the present invention, a hysteresis loop of a great magnitude is attainable even at a relatively low temperature (e.g., 700° C. or less).

Figure 2:
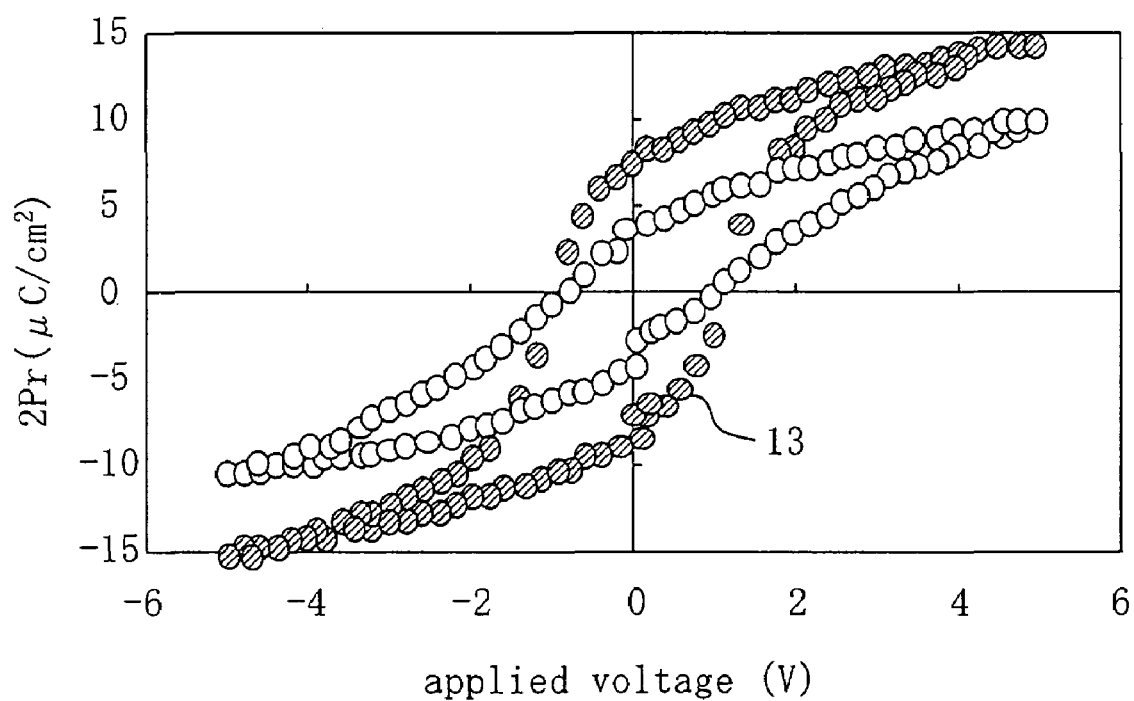
FIG. 2 is a graph illustrating the characteristics of the inventive and prior art ferroelectric thin films in comparison.

FIG. 2 illustrates a hysteresis loop obtained by the bismuth layer-structured ferroelectric thin films 13 according to the present invention. In FIG. 2, the hatched circles plot the hysteresis loop obtained when the bismuth layer-structured ferroelectric thin film 13 of the present invention was formed on the substrate. On the other hand, the open circles plot a hysteresis loop obtained when a prior art bismuth layer-structured ferroelectric thin film was formed on a substrate. As can be seen from FIG. 2, the residual polarization 2Pr is relatively weak due to undesirable effects of the c-axis-oriented crystals, not contributing to polarization, according to the prior art (plotted by the open circles). In contrast, according to the present invention (plotted by the hatched circles), a relatively strong residual polarization is attainable, since the thin film is not affected by those c-axis-oriented crystals.

Figure 3A:
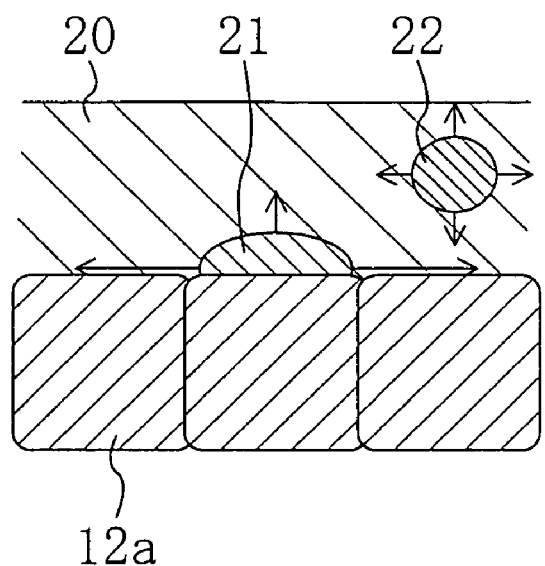
FIGS. 3A and 3B are schematic representations illustrating how crystals grow in a ferroelectric thin film.
Figure 3B:
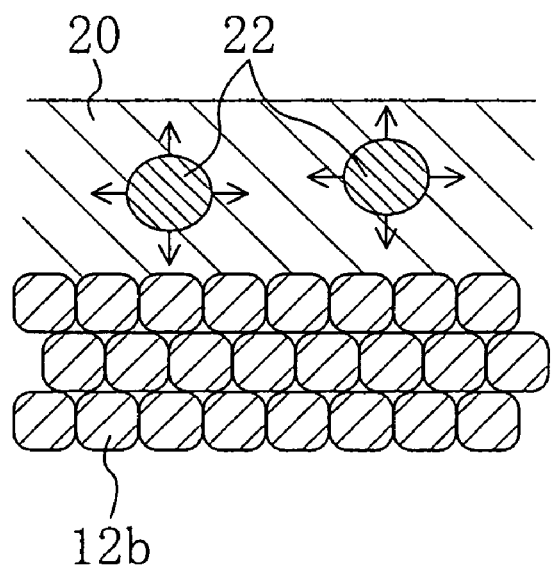

Following is the reason why we believe the bismuth layer-structured ferroelectric thin film 13 of the present invention is randomly oriented. FIG. 3A schematically illustrates how crystals grow in a ferroelectric thin film according to the prior art, while FIG. 3B schematically illustrated how crystals grow in the ferroelectric thin film 13 according to the present invention. In FIGS. 3A and 3B, a thin film 20 on a platinum electrode is formed out of a pre-cursor solution (metal alkoxide solution).

In a sol-gel process in general, crystals grow to form a thin film in any of the following two manners: interface crystal growth and in-film crystal growth. The interface crystal growth starts from nuclei 21 produced at the interface. On the other hand, the in-film crystal growth starts from nuclei 22 created in the film.

In the prior art shown in FIG. 3A, the ferroelectric thin film is formed on the platinum electrode 12a composed of columnar crystals with a typical mean grain size of as large as 100 nm or more. Accordingly, the nuclei 21 of ferroelectric crystals are created on the flat surfaces of platinum crystals located at the interface, and ferroelectric crystals grow from these nuclei 21. That is to say, in the prior art, the interface crystal growth is prevailing. These crystal nuclei 21 of the bismuth layer, created on the flat portions of the platinum crystals, are likely to be oriented along the c-axis, which is parallel to the principal surface of the substrate. As a result, the majority of crystals in the resultant film will be oriented along the c-axis.

On the other hand, according to the present invention, the ferroelectric thin film is formed on the platinum electrode 12b composed of spherical crystals with a mean grain size of 20 nm or less as shown in FIG. 3B. In this case, the total area of the flat portions of the spherical platinum crystals 12b, located at the interface, is smaller than that of the columnar crystals, and therefore, nuclei of ferroelectric crystals are less likely to be created at the interface. Thus, the in-film crystal growth will be prevailing. Since the crystal nuclei 22 created in the film are randomly oriented, almost all of the crystals in the resultant film will also be randomly oriented.

According to the first embodiment, the ferroelectric thin film is formed by the sol-gel process on the platinum electrode (i.e., conductor layer) 12 with the spherical crystal structure. Thus, the bismuth layer-structured ferroelectric thin film 13 will have a randomly oriented layered structure.

In the foregoing embodiment, the surface of the platinum electrode 12 is coated with a precursor solution containing an organometallic compound and then the substrate is introduced into a furnace and baked at a temperature between 650 and 700° C. Optionally, the coating may be subjected to rapid thermal processing (RTP). In an RTP process, a substrate (e.g., wafer) is exposed to an infrared ray, for example. Generally speaking, the polarization of a ferroelectric thin film is normally improvable by the RTP process. However, if the sol-gel and RTP processes are carried out in combination, then an even greater number of crystals in a ferroelectric thin film will be usually oriented along the c-axis. In contrast, according to the inventive process, such an unfavorable orientation is avoidable even if the RTP and sol-gel are combined. Thus, the present invention is applicable even more effectively to an RTP-assisted process. Specifically, in that case, after the surface of the platinum electrode 12 has been coated with a precursor solution containing an organometallic compound, the substrate is subjected to the RTP and then introduced into a furnace and baked. The RTA process may be performed for a period of time between 30 seconds and 30 minutes (preferably 10 minutes) within an oxygen-containing ambient at a temperature rise rate between 10 and 100° C. per second (preferably 50° C. per second) and at a process temperature between 650 and 700° C.

In the foregoing embodiment, argon gas is used as an inert gas for the sputtering process of platinum. Alternatively, any other inert gas such as helium gas may be used instead. Also, the partial pressure ratio of oxygen is defined at 4% in the sputtering process. However, the partial pressure ratio only needs to be at least 1%. The substrate is supposed to be kept at room temperature, but may be heated up to a higher temperature. Nevertheless, the temperature of the substrate is preferably about 200° C. or less. This is because oxygen will be removed from the grain boundaries and columnar crystals will be easily created at more than 200° C.

The gas pressure is supposed to be 12 mTorr (=1.6 Pa) in the foregoing embodiment, but may be between about 1 mTorr and about 20 mTorr (i.e., between about 0.13 Pa and about 2.7 Pa). This is because the substrate will not be damaged due to the sputtering at a pressure of 1 mTorr or more, and because the platinum electrode will get neither deformed nor rugged at a pressure of 20 mTorr or less.

Also, in the foregoing embodiment, the layer-structured ferroelectric thin film 13 is made of $SrBi_2Ta_2O_9$, but may naturally be made of any other ferroelectric. Examples of other usable ferroelectric materials include $SrBi_2Nb_2O_9$, $SrBi_2Ti_2O_9$, $SrBi_2(Ta_xNb_{(1-x)})_2O_9$ and $Bi_4Ti_3O_{12}$. To improve the polarization properties and reduce the leakage current or to deposit the thin film at a low temperature even more effectively, Mn, La, Ce, Dy or the like may be added at a small mole fraction.

Furthermore, in the foregoing embodiment, the ferroelectric thin film 13 is supposed to be formed by a sol-gel process to illustrate the effects of the present invention, i.e., those c-axis-oriented crystals, which are usually created by a sol-gel process, can be eliminated in the present invention. Alternatively, the ferroelectric thin film 13 may also be formed by an organometallic thermolysis process using a metal carboxide solution, for example. A randomly oriented ferroelectric thin film 13 can also be formed in a similar manner by this process.

Embodiment 2

Hereinafter, a second embodiment of the present invention will be described with reference to FIGS. 4A, 4B and 5. In the second embodiment, the difference between the first and second embodiments will be mainly described and the common features of these two embodiments will not be described or mentioned only briefly for the sake of simplicity.

A ferroelectric capacitor can be constructed by using the layer-structured ferroelectric thin film 13 and the platinum electrode 12 of the first embodiment as capacitive insulating film and lower electrode, respectively, and by forming an upper electrode on the capacitive insulating film. And if a substrate with a semiconductor integrated circuit formed thereon is used as the substrate for the ferroelectric capacitor, a ferroelectric memory can be constructed. The ferroelectric capacitor or memory can be formed by a known method except for the process step of forming the layer-structured ferroelectric thin film 13 as a capacitive insulating film.

Figure 4A:
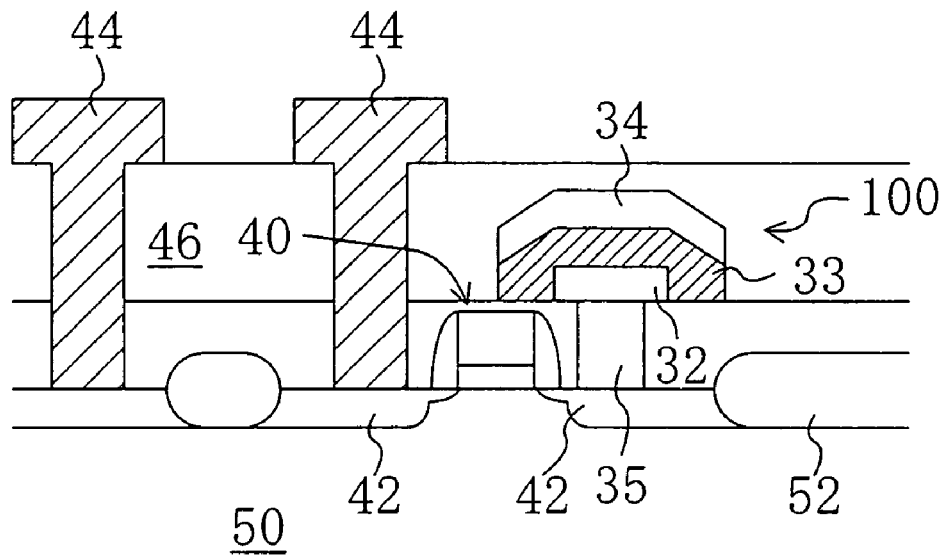
FIG. 4A is a cross-sectional view schematically illustrating a stacked memory cell structure.
Figure 4B:
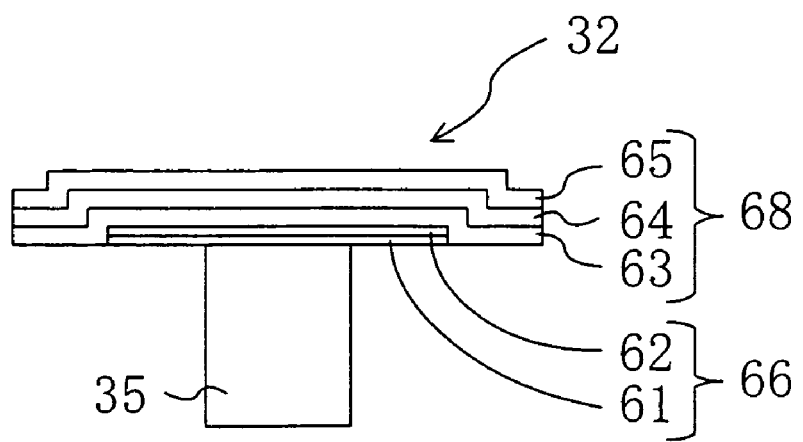
FIG. 4B illustrates a barrier layer and surrounding portions thereof shown in FIG. 4A to a larger scale.

FIG. 4A schematically illustrates a ferroelectric capacitor 100 with a stacked structure. The ferroelectric capacitor 100 is a part of a ferroelectric memory and is placed on a substrate 50 (e.g., silicon substrate) on which a semiconductor integrated circuit has been formed. The ferroelectric capacitor 100 includes: a lower electrode (barrier layer) 32; a capacitive insulating film 33 formed out of the ferroelectric thin film 13 of the first embodiment; and an upper electrode 34, which are stacked in this order one upon the other. The lower electrode 32 is electrically connected to a transistor 40 (more specifically, its doped layer 42) by way of a plug 35 made of polysilicon, for example. The transistor 40 is electrically connected to interconnects 44. An isolation oxide film (i.e., field oxide film) 52 is formed on part of the surface of the substrate 50. And an insulating film 46 is formed over the substrate 50 to cover the ferroelectric capacitor 100 and the transistor 40.

The ferroelectric capacitor 100 of this embodiment includes the capacitive insulating film 33 formed out of the ferroelectric thin film 13 that has the randomly oriented layered structure although the film 13 has been formed by the sol-gel process. Thus, the ferroelectric capacitor 100 exhibits spontaneous electric polarization strong enough to enable a nonvolatile memory to operate properly. In addition, the ferroelectric capacitor 100 is formed at a temperature as low as about 700° C. or less (e.g., between about 650 and about 700° C., preferably at about 650° C.), thus realizing a good stacked memory cell structure. Generally speaking, a stacked memory cell needs to be heat-treated at a temperature as low as between 650 and 700° C. considering the thermal resistance of the barrier layer 32 (e.g., iridium oxide layer). Since the capacitive insulating film 33 of the ferroelectric capacitor 100 can be made by heating it to about 650° C., the stacked memory cell structure can be formed just as intended.

In this case, a platinum layer (thickness: about 50 nm, for example) having a spherical crystal structure with a mean crystal grain size of 20 nm or less may be formed as the uppermost layer of the barrier layer 32. Then the ferroelectric thin film may be formed on the platinum layer by the method described in the first embodiment. In this manner, the capacitive insulating film 33 can be formed out of the ferroelectric thin film 13.

According to this embodiment, the lower electrode (barrier layer) 32 has a double barrier structure consisting of first and second barrier layers 66 and 68. More specifically, the first barrier layer 66 consists of Ti layer 61 and TiAlN layer 62, while the second barrier layer 68 consists of Ir layer 63, $IrO_2$ layer 64 and Pt layer 65 with the spherical crystal structure. That is to say, the lower electrode 32 has a multilayer structure, in which the Ti, TiAlN, Ir, $IrO_2$ and Pt layers 61, 62, 63, 64 and 65 are stacked in this order. The Ti layer 61 of the first barrier layer 66 is provided to be silicided and make electrical contact with the plug 35. The TiAlN layer 62 is provided to prevent silicidation resulting from the reaction between Ir and Si. On the other hand, the Ir and $IrO_2$ layers 63 and 64 of the second barrier layer 68 are provided as diffusion barriers against oxygen, and the Pt layer 65 is a layer functioning as an electrode.

Figure 5:
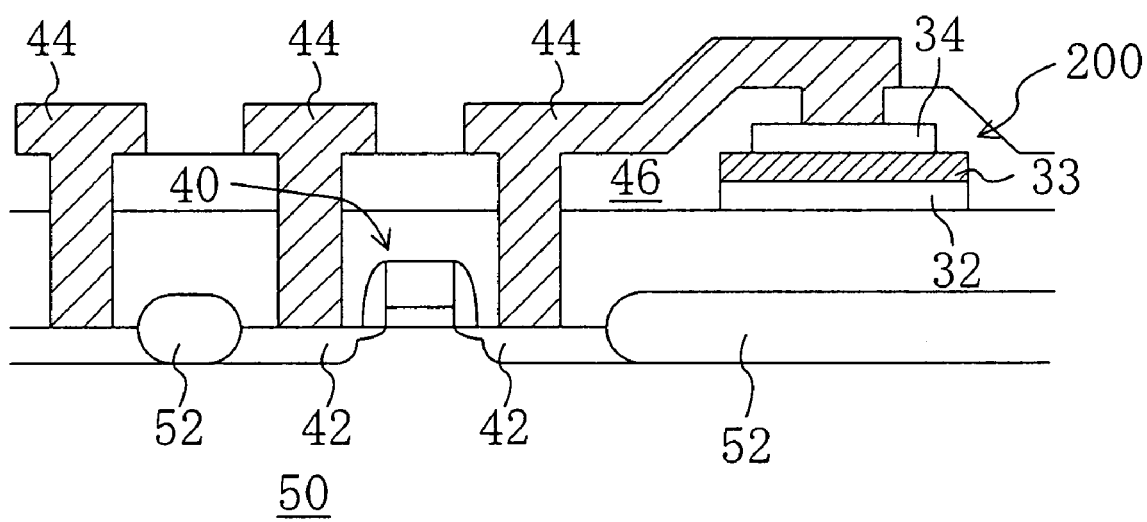
FIG. 5 is a cross-sectional view schematically illustrating a structure of a planar ferroelectric capacitor.

On the other hand, a planar structure such as that illustrated in FIG. 5 can be heat-treated at about 800° C. Thus, this structure does not have to be heat-treated at so low a temperature as that set for the stacked structure shown in FIG. 4. Even so, a ferroelectric capacitor 200 still can be fabricated in accordance with the method of the first embodiment.

In the foregoing embodiment, the ferroelectric memory cell is heat-treated at 650° C. However, the heat treatment temperature for the memory cell may be 400° C. or more, at which layer-structured ferroelectric crystals can be grown.

According to the present invention, a ferroelectric thin film with a randomly oriented layered structure is formed on the surface of a conductor layer, which has a spherical crystal structure at least on that surface. Thus, a ferroelectric thin film, exhibiting spontaneous polarization strong enough to enable a nonvolatile memory to operate properly, can be

What is claimed is:

1. A method of making a ferroelectric thin film comprising the step of forming a ferroelectric thin film with a randomly oriented layered structure on a surface of a conductor layer, the conductor layer being a platinum electrode formed by a sputtering process within an activated gas ambient with added oxygen, wherein at least the surface of the conductor layer has a spherical crystal structure having a mean grain size of 20 nm or less.

2. The method of claim 1, wherein the step of forming the ferroelectric thin film comprises the step of applying a precursor solution, containing an organometallic compound, to the surface of the conductor layer and then baking the solution on the conductor layer.

3. The method of claim 2, wherein the organometallic compound includes at least two metal atoms per molecule.

4. The method of claim 1, wherein the step of forming the ferroelectric thin film is performed at 700° C. or less.

5. The method of claim 1, wherein the ferroelectric thin film with the layered structure has a bismuth layered structure.

6. The method of claim 5, wherein the ferroelectric thin film with the bismuth layered structure contains at least one element selected from the group consisting of Mn, La, Ce and Dy at a small mole fraction.

7. The method of claim 1, wherein the conductor layer is formed by a sputtering process within an activated gas ambient.

* * * * *